(12) United States Patent
Lin et al.

(10) Patent No.: US 12,453,163 B2
(45) Date of Patent: Oct. 21, 2025

(54) ISOLATION FOR LONG AND SHORT CHANNEL DEVICES

(71) Applicant: Taiwan Semiconductor Manufacturing Company, Ltd., Hsinchu (TW)

(72) Inventors: Tzu-Ging Lin, Kaohsiung (TW); Shun-Hui Yang, Jungli (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 470 days.

(21) Appl. No.: 18/155,917

(22) Filed: Jan. 18, 2023

(65) Prior Publication Data

US 2024/0120399 A1    Apr. 11, 2024

Related U.S. Application Data

(60) Provisional application No. 63/378,642, filed on Oct. 6, 2022.

(51) Int. Cl.
*H10D 84/01* (2025.01)
*H10D 30/67* (2025.01)
(Continued)

(52) U.S. Cl.
CPC ..... *H10D 84/0151* (2025.01); *H10D 30/6735* (2025.01); *H10D 30/6757* (2025.01); *H10D 62/121* (2025.01); *H10D 84/0128* (2025.01); *H10D 84/013* (2025.01); *H10D 84/038* (2025.01)

(58) Field of Classification Search
CPC .... H01L 21/76224; H10D 30/501–509; H10D 30/6735; H10D 30/674; H10D 30/6757; H10D 62/121; H10D 84/01; H10D 84/0128; H10D 84/013; H10D 84/0151; H10D 84/0153; H10D 84/0188; H10D 84/02; H10D 84/032; H10D 84/035; H10D 84/038; H10D 84/05; H10D 84/07; H10D 84/08; H10D 84/83; H10D 84/8311; H10D 84/8312; H10D 84/83125; H10D 84/83135; H10D 84/83138; H10D 84/8314;
(Continued)

(56) References Cited

U.S. PATENT DOCUMENTS

2005/0179111 A1* 8/2005 Chao .................. H10D 84/038
257/E21.538

* cited by examiner

*Primary Examiner* — Cheung Lee
(74) *Attorney, Agent, or Firm* — Ingrassia Fisher & Lorenz, LLP

(57) ABSTRACT

Provided are multi-gate devices and methods for fabricating such devices. An exemplary method includes forming gate structures over a semiconductor material, wherein the gate structures include a long channel (LC) gate structure and a short channel (SC) gate structure; forming a patterned mask over the semiconductor material, wherein the LC gate structure and the SC gate structure are not covered by the patterned mask; and performing an etch process on the LC gate structure and on the SC gate structure through the patterned mask to remove the LC gate structure and the SC gate structure, wherein removal of the LC gate structure forms a deep trench in the semiconductor substrate having a first depth, and wherein removal of the SC gate structure forms a shallow trench in the semiconductor substrate having a second depth less than the first depth.

20 Claims, 9 Drawing Sheets

(51) Int. Cl.
*H10D 62/10* (2025.01)
*H10D 84/03* (2025.01)

(58) Field of Classification Search
CPC ..... H10D 84/8316; H10D 84/832–833; H10D 84/835; H10D 84/836; H10D 84/837–839
See application file for complete search history.

ISOLATION FOR LONG AND SHORT CHANNEL DEVICES

CROSS-REFERENCE TO RELATED APPLICATION

This application claims the benefit of U.S. Provisional Application No. 63/378,642, filed Oct. 6, 2022.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which extends completely around the channel, providing better electrostatic control than FinFETs. FinFETs and GAA devices are compatible with conventional complementary metal-oxide-semiconductor (CMOS) processes and their three-dimensional structure allows them to be aggressively scaled while maintaining gate control and mitigating SCEs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
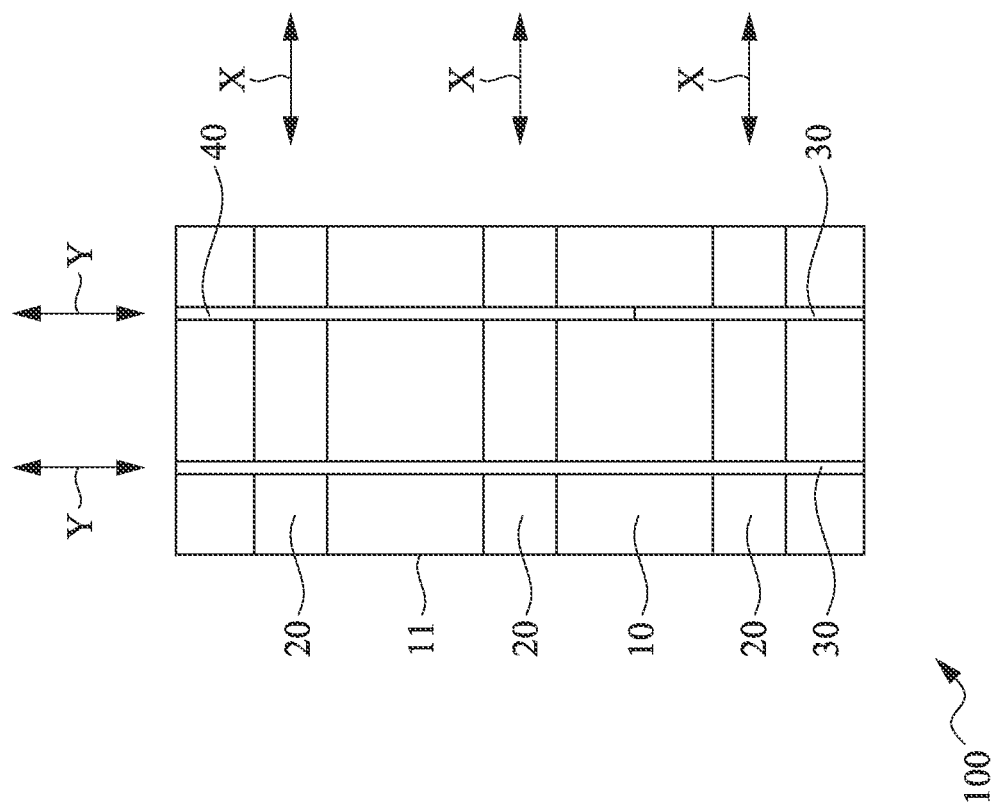
FIG. 1 is a plan view of a layout of a multi-gate device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments herein, a "material layer" is a layer that includes at least 50 wt. % of the identified material, for example at least 60 wt. % of the identified material, or at least 75 wt. % of the identified material, or at least 90 wt. % of the identified material; and a layer that is a "material" includes at least 50 wt. % of the identified material, for example at least 60 wt. % of the identified material, at least 75 wt. % of the identified material, or at least 90 wt. % of the identified material. For example, certain embodiments, each of a titanium nitride layer and a layer that is titanium nitride is a layer that is at least 50 wt. %, at least 60 wt. %, at least 75 wt. %, titanium nitride, or at least 90 wt. % titanium nitride.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

It is also noted that this disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Herein, "nanosheet channel" is intended to include nanowire channel and bar-shaped channel configurations.

Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

As described herein, an etching process is used to form trenches of appropriate depth for electric performance in different device regions of a semiconductor substrate. Specifically, in certain embodiments, a continuous poly on diffusion edge (CPODE) process is used to provide isolation between adjacent long channel devices and between adjacent short channel devices. Such a process is performed simultaneously on unmasked portions of the semiconductor substrate to selectively form a deep trench between long channel devices while selectively forming a shallow trench between short channel devices.

For purposes of this disclosure, a "diffusion edge" may be equivalently referred to as an active edge, where for example an active edge abuts adjacent active regions. Further, an active region includes a region where transistor structures are formed (e.g., including source, drain, and gate/channel structures). In some examples, active regions may be disposed between insulating regions. The CPODE process may provide an isolation region between neighboring active regions, and thus neighboring transistors, by performing a dry etching process along an active edge (e.g., at a boundary of adjacent active regions) to form a cut region and filling the cut region with a dielectric, such as silicon nitride (SiN).

Before the CPODE process, the active edge may include a GAA dummy structure having a gate stack and a plurality of channels (e.g., nanosheet channels). The plurality of channels may each include a chemical oxide layer formed thereon, and high-K dielectric/metal gate layers may be formed over the chemical oxide layer and between adjacent channels of the plurality of channels. In addition, inner spacers may be disposed between adjacent channels at lateral ends of the plurality of channels. In various examples, source/drain epitaxial (epi) layers of adjacent active regions are disposed on either side of the GAA dummy structure (formed at the active edge), such that the adjacent source/drain epi layers are in contact with the inner spacers and plurality of channels of the GAA dummy structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and related methods for performing a CPODE process without damaging source/drain epi layers of active regions adjacent to an active edge, as well as related structures. In various embodiments, a GAA dummy structure may be formed at an active edge (e.g., at a boundary of adjacent active regions), as described above, with source/drain epi layers of adjacent active regions disposed on either side of the GAA dummy structure. In certain embodiments, long channel devices are formed with narrower inner spacers at the lateral ends of the long channels, and short channel devices are formed with wider inner spacers at the lateral ends of the channels, relative to one another. Using an etch process(es) with a slow etching rate of the inner spacers allows for selectively etching deep trenches in the long channel device region while selectively etching shallow trenches in the short channel device region.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 is formed over a substrate 10. In some embodiments, the substrate 10 may be a semiconductor substrate such as a silicon substrate. The substrate 10 may include various layers, including conductive or insulating layers formed on a semiconductor substrate. The substrate 10 may include various doping configurations depending on design requirements as is known in the art. The substrate 10 may also include other semiconductors such as germanium, silicon carbide (SiC), silicon germanium (SiGe), or diamond. Alternatively, the substrate 10 may include a compound semiconductor and/or an alloy semiconductor. Further, the substrate 10 may optionally include an epi layer, may be strained for performance enhancement, may include a silicon-on-insulator (SOI) structure, and/or have other suitable enhancement features.

FIG. 1 illustrates a unit cell 11, i.e., a portion of the semiconductor substrate 10. As shown, parallel active regions 20 are spaced apart from one another and extend in an X-direction. Further, parallel gate lines 30 are spaced apart from one another and extend in a Y-direction perpendicular to the X-direction. Exemplary gate lines 30 are formed from conductive material such as metal and form gate structures for the multi-gate device 100.

As further shown in FIG. 1, a cut region or trench is formed in one gate line 30 and is filled with isolation 40. Such isolation 40 may isolate adjacent devices from one another as described below.

Figure 2:
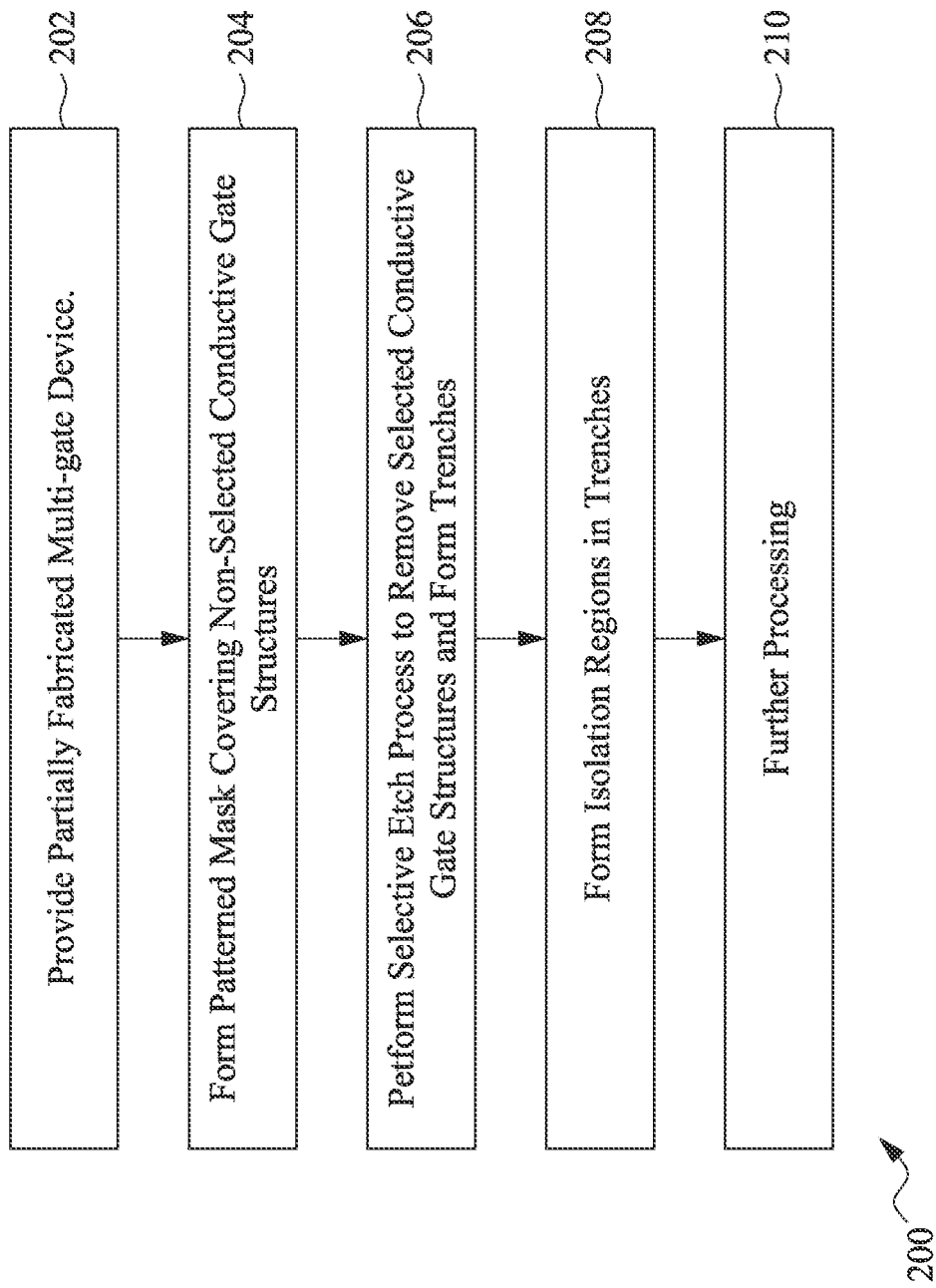
FIG. 2 is a flow chart illustrating a method, in accordance with some embodiments.

Referring to FIG. 2, illustrated therein is a method 200 of fabrication of a semiconductor device 200 (such as a multi-gate device) using a CPODE process, in accordance with various embodiments. Method 200 is discussed below with reference to a GAA device having a channel region that may be referred to as a nanosheet and which may include various geometries (e.g., cylindrical, bar-shaped) and dimensions. However, it will be understood that aspects of method 200, including the disclosed CPODE process, may be equally applied to other types of multi-gate devices without departing from the scope of the present disclosure. In some embodiments, method 200 may be used to fabricate the multi-gate device 100, described above with reference to FIG. 1. Thus, one or more aspects discussed above with reference to the multi-gate device 100 may also apply to method 200. It is understood that method 200 includes steps having features of a complementary metal-oxide-semiconductor (CMOS) technology process flow and thus, are only described briefly herein. Also, additional steps may be performed before, after, and/or during method 200.

Method 200 is described below with reference to FIGS. 3-6 which illustrate the multi-gate device 100 at various stages of fabrication according to method 200. FIGS. 3-6 provide cross-sectional views of an embodiment of the semiconductor device 100 along a plane substantially parallel to a plane defined by an X-axis in FIG. 1.

Further, the semiconductor device 100 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 100 includes a plurality of semiconductor devices (e.g., transistors), including PFETs, NFETs, etc., which may be interconnected. Moreover, it is noted that the process steps of method 200, including any descriptions given with reference to the figures are merely exemplary and are not intended to be limiting beyond what is specifically recited in the claims that follow.

Method 200 begins at block 202 where a partially fabricated multi-gate device is provided. Referring to the example of FIG. 3, in an embodiment of block 202, a device 100 includes a direct current (DC) device region 310 and an alternating current (AC) device region 320. In certain embodiments, the DC device region 310 may be considered to be a long channel (LC) device region 310, and the AC device region 320 may be considered to be a short channel (SC) device region 320.

As shown, each device region 310/320 includes a first active region 311/321, a second active region 312/322, and an active edge 313/323 that is defined at a boundary between the first active region 311/321 and the second active region 312/322. In some embodiments, each first active region 311/321 includes a first GAA device structure 315/325, each second active region 312/322 includes a second GAA device structure 316/326, and each active edge 313/323 includes a GAA dummy structure 317/327, as described below. In accordance with embodiments of the present disclosure, a CPODE process may provide an isolation region between each first active region 311/321 and each respective adjacent second active region 312/322, and thus between the pair of GAA device structures 315 and 316 in the DC device region 310 and between the pair of GAA device structures 325 and 326 in the AC device region 320, by performing a dry etching process along the active edges 313 and 323 to form a cut region and filling the cut region with a dielectric, as described in more detail below. More specifically, the etching process is performed on both active edges 313 and 323 at the same time such that a common etching process is utilized.

Each first GAA device structure 315/325, each second GAA device structure 316/326, and each GAA dummy structure 317/327 are formed on a substrate 10 having fins 12 that extend in the X-direction. In some embodiments, the substrate 10 may be a semiconductor substrate such as a silicon substrate. The substrate 10 may include various layers, including conductive or insulating layers formed on a semiconductor substrate. The substrate 10 may include various doping configurations depending on design requirements as is known in the art. The substrate 10 may also include other semiconductors such as germanium, silicon carbide (SiC), silicon germanium (SiGe), or diamond. Alternatively, the substrate 10 may include a compound semiconductor and/or an alloy semiconductor. Further, the substrate 10 may optionally include an epi layer, may be strained for performance enhancement, may include a silicon-on-insulator (SOI) structure, and/or have other suitable enhancement features.

The fins 12 may include nanosheet channel layers, collectively identified by reference number 15. In some embodiments, the nanosheet channel layers 15 may include silicon (Si). However, in some embodiments, the nanosheet channel layers 15 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, the nanosheet channel layers 15 may be epitaxially grown by a molecular beam epitaxy (MBE) process, a metalorganic chemical vapor deposition (MOCVD) process, and/or other suitable epitaxial growth processes.

In various embodiments, each of the fins 12 includes a substrate portion 13 formed from the substrate 10 and the nanosheet channel layers 15. It is noted that while the fins 12 are illustrated as including three (3) nanosheet channel layers 15, this is for illustrative purposes only and is not intended to be limiting beyond what is specifically recited in the claims. It can be appreciated that any number of nanosheet channel layers 15 can be formed, where for example, the number of nanosheet channel layers 15 depends on the desired number of channels regions for the GAA device (e.g., the device 100). In some embodiments, the number of nanosheet channel layers 15 is from two to ten.

Shallow trench isolation (STI) features may also be formed interposing the fins 12, with STI features in front of and behind the fins 12 in the Y-direction (i.e., not visible in the X-direction cross-sectional views of FIGS. 3-6). In some embodiments, the STI features include $SiO_2$, silicon nitride, silicon oxynitride, fluorine-doped silicate glass (FSG), a low-k dielectric, combinations thereof, and/or other suitable materials known in the art. In various examples, the dielectric layer used to form the STI features may be deposited by a CVD process, a subatmospheric CVD (SACVD) process, a flowable CVD process, an ALD process, a PVD process, and/or other suitable process.

In various examples, each GAA structure 315, 316, and 317 includes a gate structure 160, and each GAA structure 325, 326, and 327 includes a gate structure 260. Gate structures 160/260 may include a high-K gate dielectric layer 161/261 and a conductive metal 162/262 in a high-K/metal gate stack 160/260. In some embodiments, the gate structure 160/260 may form the gate associated with the multi-channels provided by the nanosheet channel layers 15 in the channel region of the first GAA devices 315/325 and the second GAA devices 316/326. The gate structure 160/260 may include an interfacial layer (IL) (not shown), with the high-K gate dielectric layer 161/261 formed over the interfacial layer. In some embodiments, the gate dielectric has a total thickness of from 1 to 5 nanometers (nm). High-K gate dielectrics, as used and described herein, include dielectric materials having a high dielectric constant, for example, greater than that of thermal silicon oxide (about 3.9).

In some embodiments, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. In some examples, the interfacial layer includes the chemical oxide layer, discussed above.

An exemplary high-K gate dielectric layer 161/261 may include a high-K dielectric material such as hafnium oxide ($HfO_2$). Alternatively, the high-K gate dielectric layer 161/261 may include other high-K dielectric materials, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides (SiON), combinations thereof, or other suitable material. The high-K gate dielectric layer 161/261 may be formed by ALD, physical vapor deposition (PVD), CVD, oxidation, and/or other suitable methods.

The gate structure 160/260 may further include a metal gate material 162/262 formed over the gate dielectric layer 161/261. The metal layer 162/262 may include a metal, metal alloy, or metal silicide. The metal layer 162/262 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 162/262 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof In various embodiments, the metal layer 162/262 may be formed by ALD, PVD, CVD, e-beam evaporation, or other suitable process. Further, the metal layer 162/262 may be formed separately for N-type and P-type transistors which may use different metal layers. In addition, the metal layer 162/262 may provide an N-type or P-type work function, may serve as a transistor gate electrode, and in at least some embodiments, the metal layer 162/262 may include a polysilicon layer.

Figure 3:
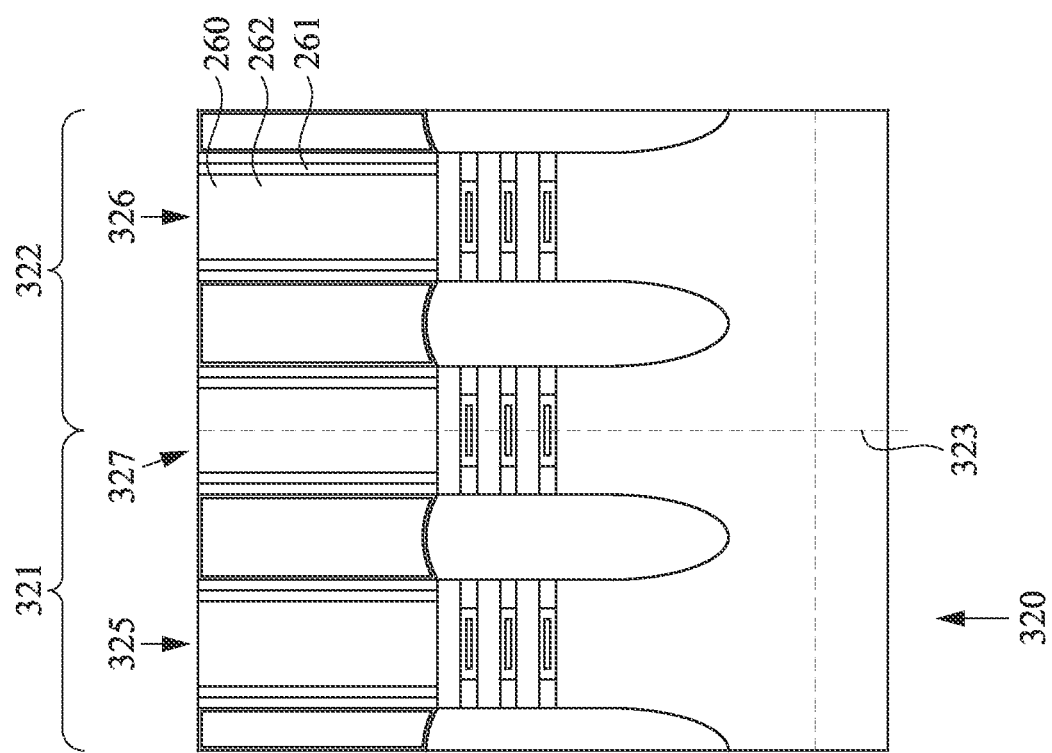
FIGS. 3-6 are cross-sectional views of a multi-gate device including a direct current (DC) device region and an alternating current (AC) device region during successive stages of fabrication, in accordance with some embodiments.
Figure 3:
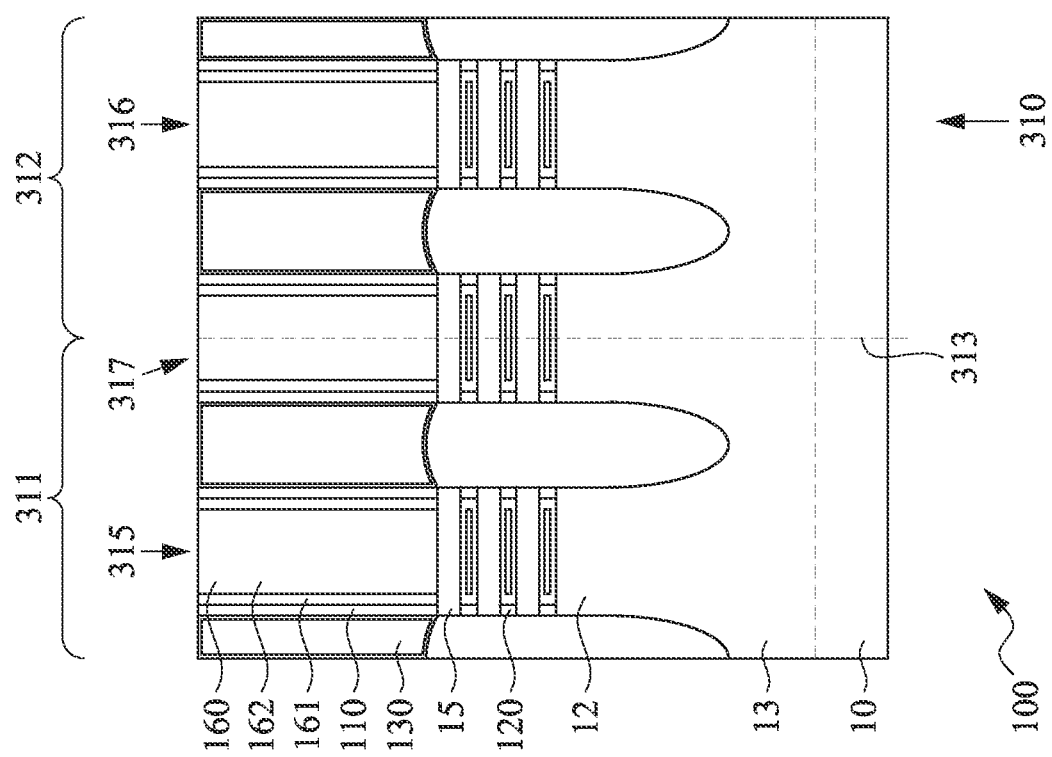
Figure 7:
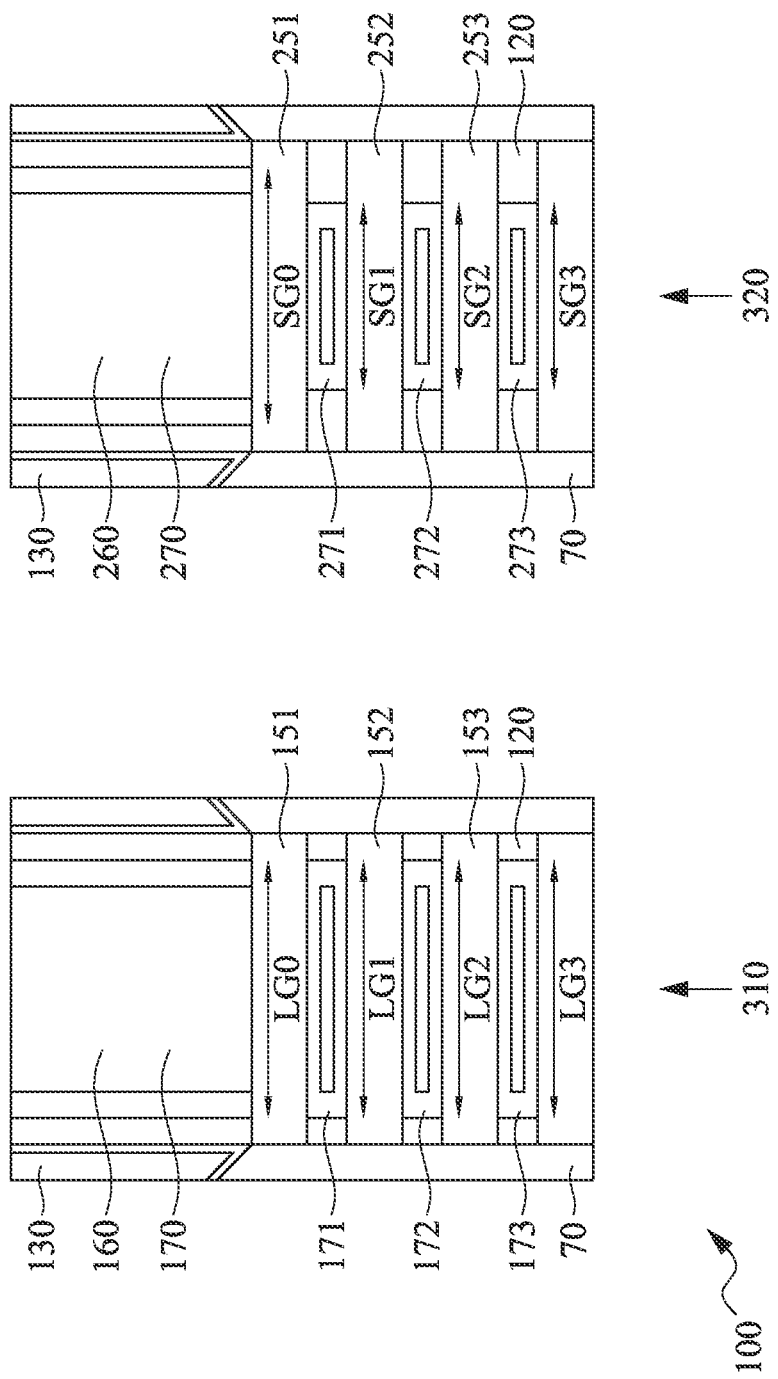
FIG. 7 is a focused cross-sectional view of a gate structure in a DC device region and of a gate structure in an AC device region, such as from the multi-gate device of FIG. 3, in accordance with some embodiments.

Cross-referencing FIG. 3 with FIG. 7, which provides a focused view of the gate structure of a GAA structure in the DC device region 310 and a GAA structure in the AC device region 320, the GAA structure in the DC device region 310 includes an uppermost nanosheet channel 151, a middle nanosheet channel 152, and a lowest nanosheet channel 153 that each extend between opposite source/drain regions 70. Also, the GAA structure in the AC device region 320 includes an uppermost nanosheet channel 251, a middle nanosheet channel 252, and a lowest nanosheet channel 253 that each extend between the opposite source/drain regions 70.

Further, it may be seen that each gate structure 160/260 includes a portion 170/270 lying over the uppermost nanosheet channel layer 151/251, as well as a portion 171/271 between uppermost nanosheet channel layer 151/251 and middle nanosheet channel 152/252, a portion 172/272 between middle nanosheet channel 152/252 and lowest nanosheet channel 153/253, and a portion 173/273 under the lowest nanosheet channel 153/253. Each nanosheet channel layer 15 provides a semiconductor channel layer for the first GAA devices 315/325 and the second GAA devices 316/326.

In some examples, an additional metal layer (not shown) may be formed over the metal layer 162/262. In some embodiments, the additional metal layer includes selectively-grown tungsten (W), although other suitable metals may also be used. In at least some examples, the additional metal layer includes a fluorine-free W (FFW) layer. In various examples, the additional metal layer may serve as an etch-stop layer and may also provide reduced contact resistance (e.g., to the metal layer 162/262).

In some embodiments, a spacer layer 110 may be formed on sidewalls of a top portion of the gate structure 160/260 of each of the first GAA devices 315/325, the second GAA devices 316/326, and the GAA dummy structures 317/327. The spacer layer 110 may be formed prior to formation of the high-K/metal gate stack of the gate structure. For example, in some cases, the spacer layer 110 may be formed on sidewalls of a previously formed dummy (sacrificial) gate stack that is removed and replaced by the high-K/metal gate stack, described above, as part of a replacement gate (gate-last) process. In some cases, the spacer layer 110 may have a thickness of from 2 to 10 nanometers (nm). In various embodiments, the thickness of the spacer layer 110 may be selected to provide a desired sidewall profile following a subsequent CPODE dry etching process, as discussed in more detail below. In some examples, the spacer layer 110 may include a dielectric material such as silicon oxide, silicon nitride, silicon carbide, silicon oxynitride, SiCN, silicon oxycarbide, SiOCN, SiOHCN, a low-K material (e.g., with a dielectric constant 'k'<7), and/or combinations thereof. In some embodiments, the spacer layer 110 includes multiple layers, such as main spacer layers, liner layers, and the like.

In various examples, each of the first GAA device structures 315/325, the second GAA device structures 316/326, and the GAA dummy structures 317/327 of the device 100 further includes inner spacers 120. The inner spacers 120 may be disposed between adjacent channels of the nanosheet channel layers 15, at lateral ends of the nanosheet channel layers 15, and in contact with portions of the gate structure that interpose each of the nanosheet channel layers 15. In some embodiments, the inner spacers 120 include SiOCN. In some examples, the inner spacers 120 may include silicon oxide, silicon nitride, silicon carbide, silicon oxynitride, SiCN, silicon oxycarbide, a low-K material (e.g., with a dielectric constant 'k'<7), and/or combinations thereof. In various examples, the inner spacers 120 may extend beneath the spacer layer 110, described above, while abutting adjacent source/drain features, described below.

As shown in FIG. 7, inner spacers 120 in the AC device region 320 have larger lengths, as compared to the lengths of the inner spacers 120 in the DC device regions 310. As described below, the larger inner spacers 120 in the AC device region 320 lead to having shorter metal portions 271-273, while the shorter inner spacers 120 in the DC device region 310 lead to having longer metal portions 171-173.

In some embodiments, source/drain features 70 are formed in source/drain regions adjacent to and on either side of the gate structure of each of the first GAA device structure 315/325 and the second GAA device structure 316/326 and over the substrate portion 13. As a result, the GAA dummy structure 317/327 is disposed between a first source/drain feature 70 of the first GAA device structure 315/325 (in the first active region 311) and a second source/drain feature 70 of the second GAA device structure 316/326 (in the second active region 312). As shown, the source/drain features 70 of the first GAA device structure 315/325 are in contact with the inner spacers 120 and nanosheet channel layers 15 of the first GAA device structure 315/325, and the source/drain features 70 of the second GAA device structure 316/326 are in contact with the inner spacers 120 and nanosheet channel layers 15 of the second GAA device structure 316/326. Moreover, the source/drain features 70 (of the first and second GAA devices 315/325, 316/326) disposed on either side of the GAA dummy structure 317/327 are in contact with the inner spacers 120 and nanosheet channel layers 15 of the GAA dummy structure 317/327.

In various examples, the source/drain features 70 include semiconductor epi layers such as Ge, Si, GaAs, AlGaAs, SiGe, GaAsP, SiP, or other suitable material, which may be formed by one or more epitaxial processes. In some embodiments, the source/drain features 70 may be in-situ doped during the epi process. For example, in some embodiments, epitaxially grown SiGe source/drain features may be doped with boron. In some cases, epitaxially grown Si source/drain features may be doped with carbon to form Si:C source/drain features, phosphorous to form Si:P source/drain features, or both carbon and phosphorous to form SiCP source/drain features. In some embodiments, the source/drain features 70 are not in-situ doped, and instead an implantation process is performed to dope the source/drain features 70. In some embodiments, formation of the source/drain features 70 may be performed in separate processing sequences for each of N-type and P-type source/drain features.

An inter-layer dielectric (ILD) layer 130 may also be formed over the device 100. In some embodiments, a contact etch stop layer (CESL) (not shown) is formed over the device 100 prior to forming the ILD layer 130. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 130 includes materials such as tetraethylorthosilicate (TEOS) oxide, un-doped silicate glass, or doped silicon oxide such as borophosphosilicate glass (BPSG), FSG, phosphosilicate glass (PSG), boron doped silicon glass (BSG), and/or other suitable dielectric materials. The ILD layer 130 may be deposited by a PECVD process or other suitable deposition technique. In some embodiments, a hard mask layer (not shown in FIGS. 3 and 7) may be formed over the ILD layer 130. In some cases, the hard mask layer may include SiN.

In FIG. 7, various portions of the gates are identified. As shown, the GAA structure in the DC device region 310 includes a main portion 170 of the gate lying over the uppermost nanosheet channel 151, a portion 171 lying directly under the uppermost nanosheet channel 151, a portion 172 lying directly under the middle nanosheet channel 152, and a portion 173 lying directly under the lowest nanosheet channel 153. The main portion 170 of the gate extends between opposite portions of the spacer layer 110. Each portion 171, 172, and 173 of the gate extends between opposite inner spacers 120.

In the DC device region 310, gate portions 170 have a length LG0 in the X-direction of from 14.0 to 17.9 nanometers (nm), and an average length LG0 of about 15.9 nanometers (nm).

In the DC device region 310, gate portions 171 have a length LG1 in the X-direction of from 13.6 to 18.1 nanometers (nm), and an average length LG1 of about 15.8 nanometers (nm).

In the DC device region 310, gate portions 172 have a length LG2 in the X-direction of from 13.9 to 17.5 nanometers (nm), and an average length LG2 of about 15.6 nanometers (nm).

In the DC device region 310, gate portions 173 have a length LG3 in the X-direction of from 15.9 to 19.6 nanometers (nm), and an average length LG3 of about 17.5 nanometers (nm).

In exemplary embodiments, in the DC device region, the ratio of length LC1 to length LG1 is 1.2:1, the ratio of length LC2 to length LG2 is 1.2:1, and the ratio of length LC3 to length LG3 is 1.1:1. Overall, the ratio of channel length to gate length in the DC device region is 1.167:1.

As shown, the GAA structure in the AC device region 320 includes a main portion 270 of the gate lying over the uppermost nanosheet channel 251, a portion 271 lying directly under the uppermost nanosheet channel 251, a portion 272 lying directly under the middle nanosheet channel 252, and a portion 273 lying directly under the lowest nanosheet channel 253. The main portion 270 of the gate extends between opposite portions of the spacer layer 110. Each portion 271, 272, and 273 of the gate extends between opposite inner spacers 120.

In exemplary embodiments, dimensions of the GAA structures in the AC device region 320 differ from those of the GAA structures in the DC device region 310.

In the AC device region 320, gate portions 270 have a length SG0 in the X-direction of from 14.4 to 17.6 nanometers (nm), and an average length SG0 of about 15.9 nanometers (nm).

In the AC device region 320, gate portions 271 have a length SG1 in the X-direction of from 5.9 to 11.2 nanometers (nm), and an average length SG1 of about 8.4 nanometers (nm).

In the AC device region 320, gate portions 272 have a length SG2 in the X-direction of from 4.3 to 11.3 nanometers (nm), and an average length SG2 of about 7.7 nanometers (nm).

In the AC device region 320, gate portions 273 have a length SG3 in the X-direction of from 6.9 to 12.3 nanometers (nm), and an average length SG3 of about 9.8 nanometers (nm).

In exemplary embodiments, in the AC device region, the ratio of length LC1 to length LG1 is 2.2:1, the ratio of length LC2 to length LG2 is 2.2:1, and the ratio of length LC3 to length LG3 is 1.6:1. Overall, the ratio of channel length to gate length in the AC device region is 2:1.

As may be seen from the above, gate portions 171, 172, and 173 have an average gate length of greater than 13 nanometers (nm), such as greater than 13.5, or greater than 14, or greater than 14.5, or greater than 15, or greater than 15.5, or greater than 16 nanometers (nm). Gate portions 271, 272, and 273 have an average gate length of less than 11 nanometers (nm), such as less than 10.5, or less than 10, or less than 9.5, or less than 9, or less than 8.7 nanometers (nm).

In exemplary embodiments, the average gate length of gate portions 171, 172, and 173 is greater than the average gate length of gate portions 271, 272, and 273, such as being at least 1.1 times greater, 1.2 times greater, 1.3 times greater, 1.4 times greater, 1.5 times greater, 1.6 times greater, 1.7 times greater, or 1.8 times greater.

In exemplary embodiments, the average gate length of gate portion 171 is greater than the average gate length of gate portion 271, such as being at least 1.1 times greater, 1.2 times greater, 1.3 times greater, 1.4 times greater, 1.5 times greater, 1.6 times greater, 1.7 times greater, or 1.8 times greater.

In exemplary embodiments, the average gate length of gate portion 172 is greater than the average gate length of gate portion 272, such as being at least 1.1 times greater, 1.2 times greater, 1.3 times greater, 1.4 times greater, 1.5 times greater, 1.6 times greater, 1.7 times greater, 1.8 times greater, 1.9 times greater, or 2.0 times greater.

In exemplary embodiments, the average gate length of gate portion 173 is greater than the average gate length of gate portion 273, such as being at least 1.1 times greater, 1.2 times greater, 1.3 times greater, 1.4 times greater, 1.5 times greater, 1.6 times greater, 1.7 times greater, or 1.75 times greater.

Referring to FIG. 2, after block 202, method 200 proceeds to a cut metal gate (CMG) process. In exemplary embodiments, the cut metal gate process is performed to isolate the metal layers 162/262 of adjacent structures.

Figure 4:
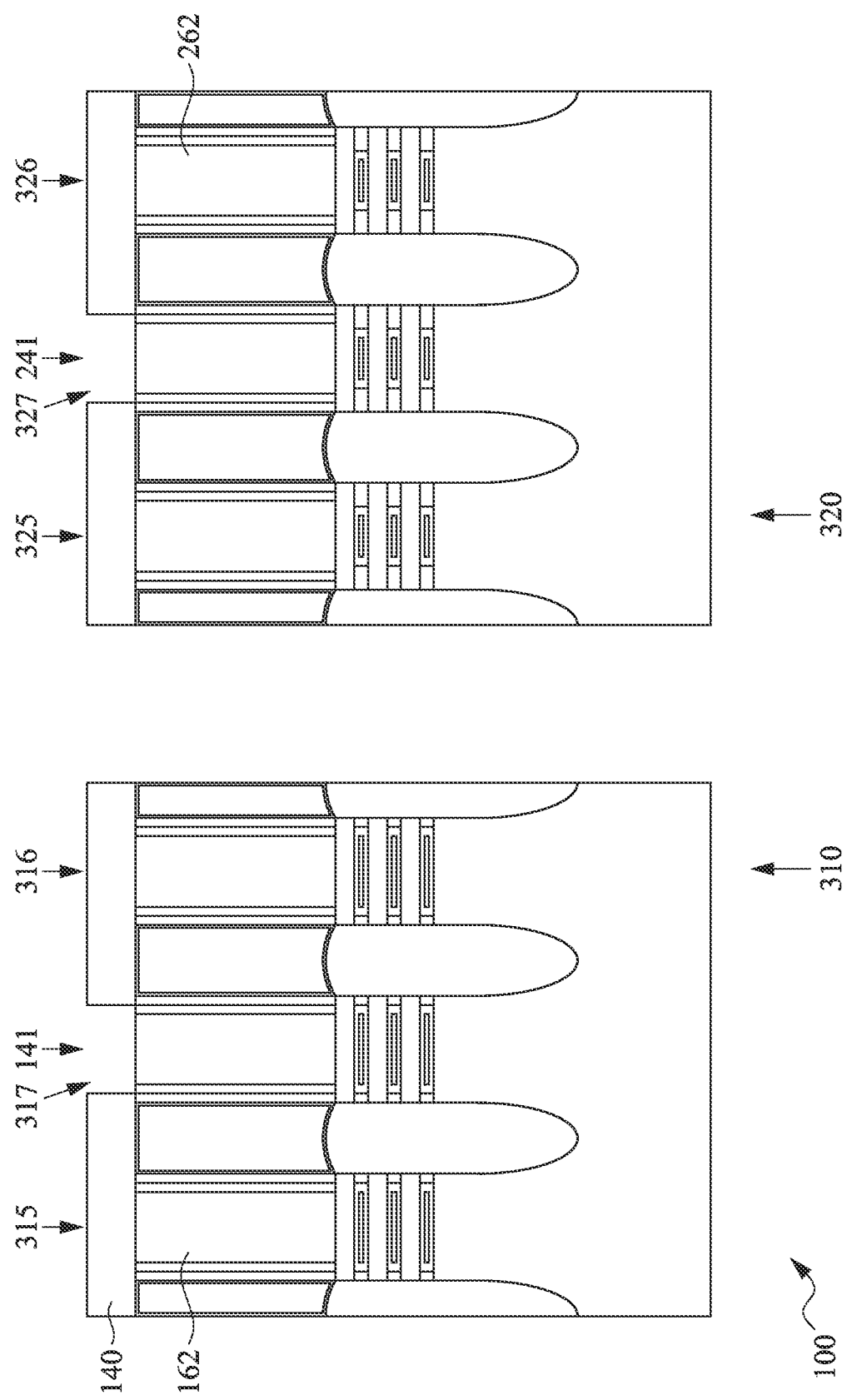

Specifically, method 200 includes, at block 204, forming a patterned mask covering non-selected structures, as shown in FIG. 4. By way of example, a photolithography and etch process may be performed to form a patterned hard mask 140 lying over the first and second GAA devices 315/325 and 316/326, while the dummy structures 317/327 are not covered. Specifically, the patterned hard mask 140 defines an opening 141 overlying dummy gate structure 317 and an opening 241 overlying dummy gate structure 327. In exemplary embodiments, the hard mask is silicon nitride. In certain embodiments, the hard mask layer may be formed patterned, resulting in the structure of FIG. 4, as part of a process used to remove previously formed sacrificial gate stacks and to form replacement high-K/metal gate stack.

Figure 5:
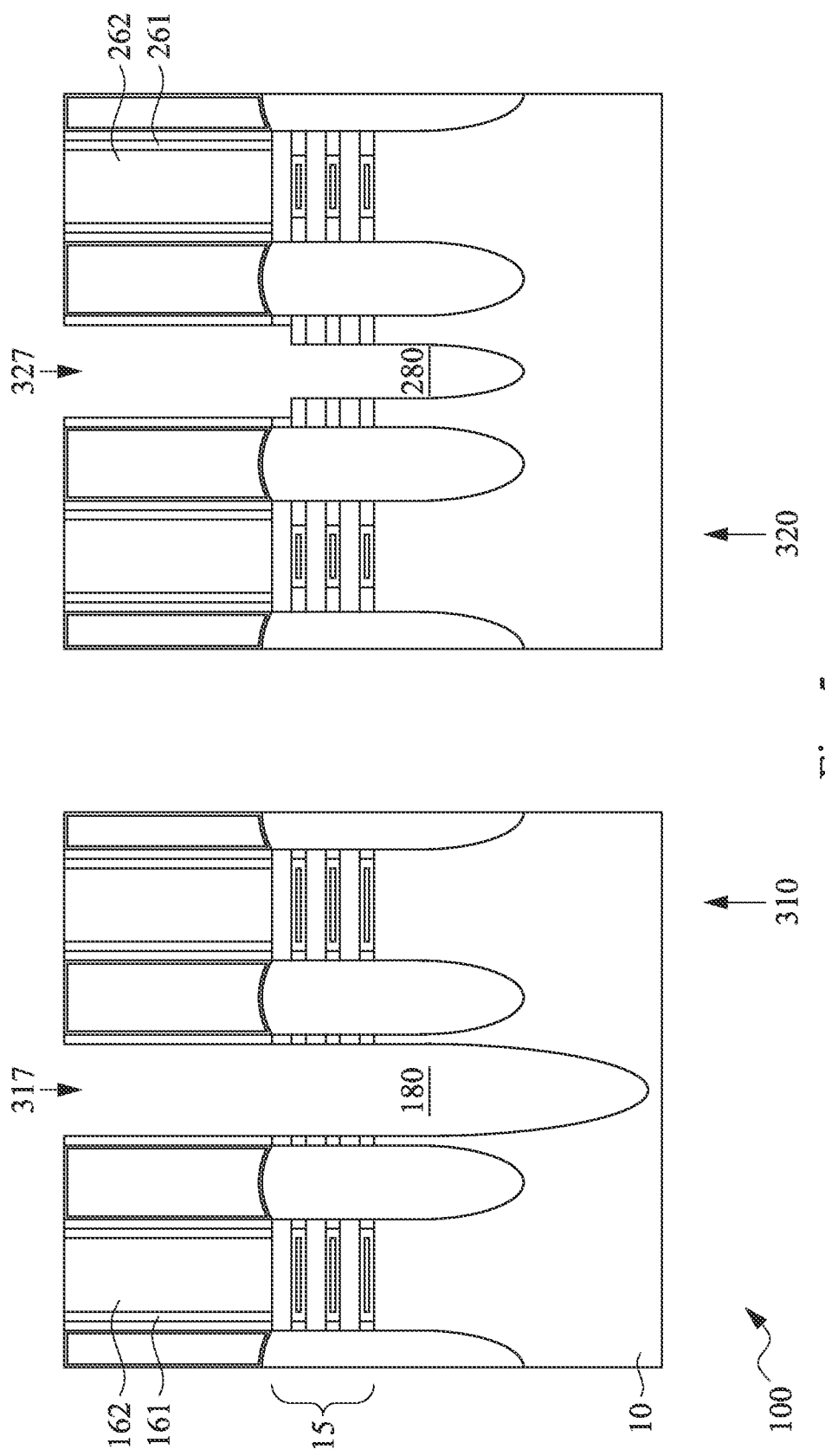

Thereafter, method 200 includes, at block 206, performing a selective etch process over both the DC device region 310 and the AC device region 320 to remove selected structures, such that the dummy gate structure 317 and the dummy gate structure 327 are simultaneously etched and removed. It is noted that such etching process does not include masking device region 310 or device region 320 while the other region 320 or 310 is unmasked. Specifically, dummy structure 317 is not masked while dummy structures 327 is etched, and dummy structure 327 is not masked while dummy structures 317 is etched As shown in FIG. 5, during the etching process, the metal gate material 162/262, high-k gate dielectric 161/261, nanosheet channels 15, and a portion of substrate 10 under the dummy structures 317/327 are etched to form trenches 180/280 in cut metal gate regions. In various examples, the trenches 180/280 may be etched using a dry etch (e.g., reactive ion or plasma etching).

The etching process may include an initial selective deposition of a liner (not shown) over the hard mask 140. For example, a CH 4 deposition process may be performed to selectively deposit the liner on the hard mask 140 (shown in FIG. 4).

The etching process may be performed by any highly directional etch processes that selectively etch silicon over silicon oxide or silicon nitride.

The exemplary etching process includes Si etch steps with highly selective etchants, such as HBr based plasma, which can efficiently remove Si with minor damage to the inner spacer, which may be consist of silicon, carbon, nitrogen, and oxygen. The etch rates and selectivity can be tuned by adding $O_2$ or $CO_2$ into the HBr plasma. During the etching processes, sidewall passivation steps may be used to preserve the CD of trenches without being broadening by the Si etch steps. For example, sidewall passivation steps utilizing $SiCl_4$, HBr, and $O_2$ precursors may be used to form sidewall oxide for this purpose. Furthermore, to avoid having the etch stopped by etch by-product or oxide passivation layers, break-through steps utilizing low selective etchants, such as $CF_4$, may be used to remove them.

As shown in FIG. 5, the trench 180 etched in the DC device area 310 extends more deeply into the substrate 10 than the trench 280 etched in the AC device area 320. The difference in depth is believed to be caused by the differing structure of the dummy structures 317 and 327. Specifically, the dimensions of the channel regions, the inner spacers, and the inter-channel conductive portions differ and cause different etching results, as described below.

Figure 8:
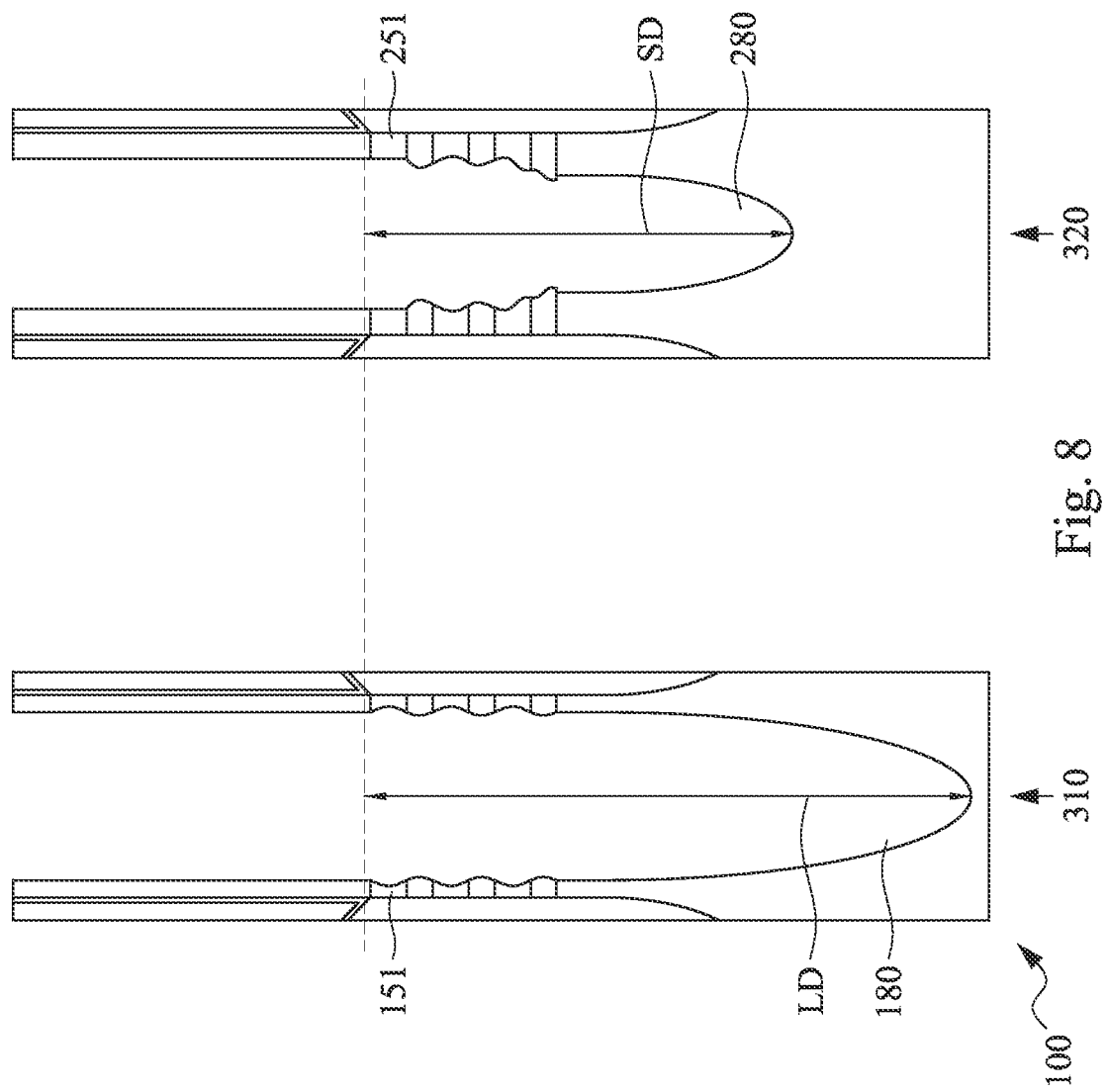
FIGS. 8 and 9 are focused cross-sectional views of a trench etched in a DC device region and of a trench etched in an AC device region, such as from the multi-gate device of FIG. 5, in accordance with some embodiments.

FIG. 8 provides a focused view on the trenches 180/280 formed by the etching process. As shown, the depth of each trench 180/280 may be measured from a top surface of the uppermost nanosheet channel 151/251. As shown, the trench 180 in the DC device region 310 has a depth LD in the Z-direction of from 119.1 to 153.2 nanometers (nm), and an average depth of about 141.6 nanometers (nm). Further, the trench 280 in the AC device region 320 has a depth SD in the Z-direction of from 53.6 to 76.3 nanometers (nm), and an average depth of about 63.1 nanometers (nm).

In exemplary embodiments, depth LD is greater than depth SD, such as at least 1.5 times greater, 1.6 times greater, 1.7 times greater, 1.8 times greater, 1.9 times greater, 2 times greater, 2.1 times greater, 2.2 times greater, or 2.25 times greater.

In exemplary embodiments, in the DC device region, the trench aspect ratio, as determined by the average depth over the average sheet length, is from 5 to 10, such as from 6 to 9, for example from 7 to 8, such as 7.5. Further, in exemplary embodiments, in the AC device region, the trench aspect ratio, as determined by the average depth over the average sheet length, is from 1 to 6, such as from 2 to 5, for example from 3 to 4, such as 3.7.

Figure 9:
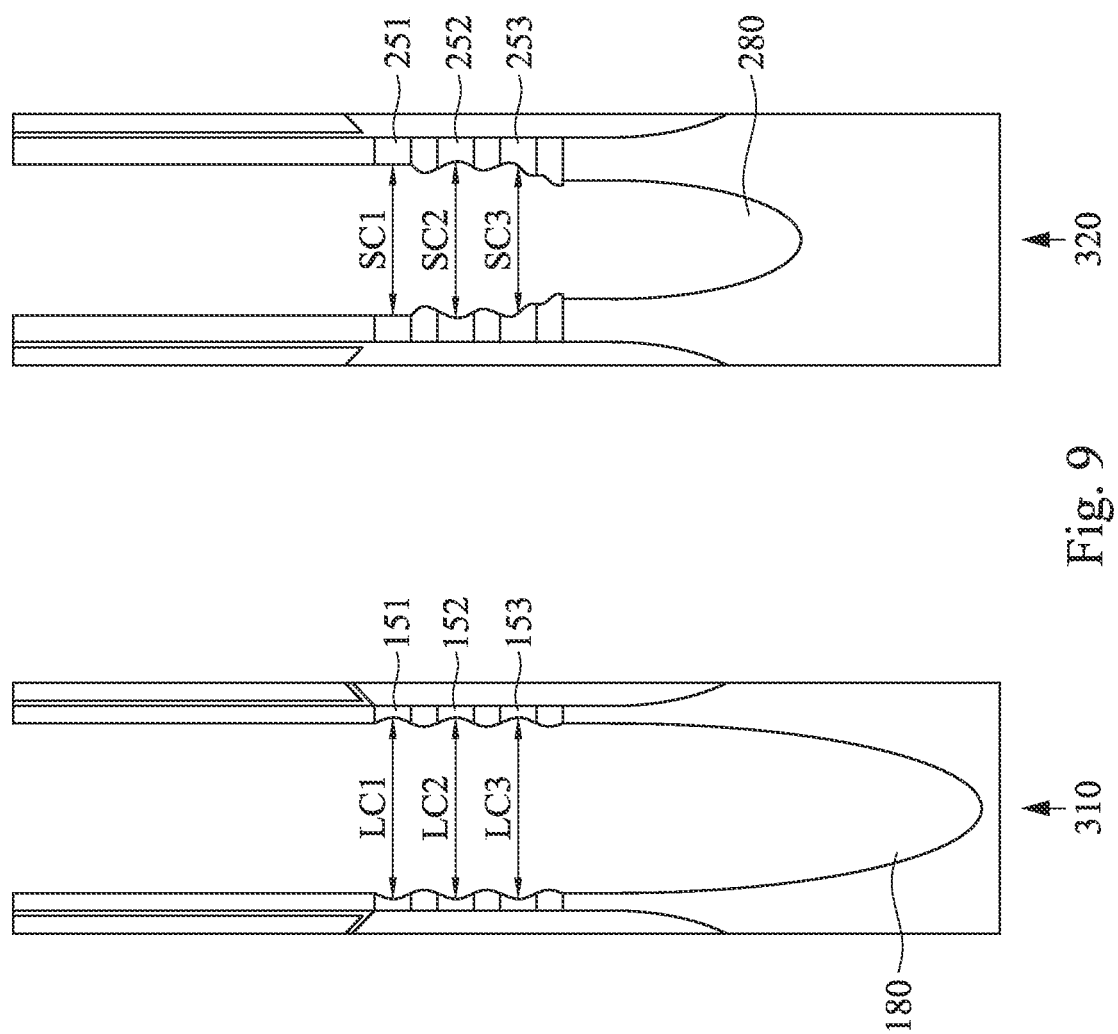

FIG. 9 provides a focused view on the trenches 180/280 formed by the etching process. As shown, the width of the trenches 180/280 are different. More specifically, each trench includes a void in each respective channel layer, and the critical dimension or width of the void in each channel layer 151, 152, 153, 251, 252, and 253 may be unique.

In the DC device region 310, uppermost nanosheet channels 151 have a void length LC1 in the X-direction of from 17.3 to 19.4 nanometers (nm), and an average void length LC1 of about 19.4 nanometers (nm). In the DC device region 310, middle nanosheet channels 152 have a void length LC2 in the X-direction of from 16.7 to 19.0 nanometers (nm), and an average void length LC2 of about 18.1 nanometers (nm). In the DC device region 310, lowest nanosheet channels 153 have a void length LC3 in the X-direction of from 17.6 to 19.0 nanometers (nm), and an average void length LC3 of about 19.0 nanometers (nm).

In exemplary embodiments, an average nanosheet channel void length in the DC device region 310 is greater than 16 nanometers (nm), such as greater than 16.5, or greater than 17, or greater than 17.5, or greater than 18, or greater than 18.5 nanometers (nm). In exemplary embodiments, an average nanosheet channel void length in the DC device region 310 is less than 21 nanometers (nm), such as less than 20.5, or less than 20, or less than 19.5, or less than 19 nanometers (nm). In an exemplary embodiment, the average nanosheet channel void length in the DC device region 310 is about 18.83 nanometers (nm).

In the AC device region 320, uppermost nanosheet channels 251 have a void length SC1 in the X-direction of from 16.9 to 20.2 nanometers (nm), and an average void length SC1 of about 18.4 nanometers (nm). In the AC device region 320, middle nanosheet channels 252 have a void length SC2 in the X-direction of from 15.9 to 17.8 nanometers (nm), and an average void length SC2 of about 16.9 nanometers (nm). In the AC device region 320, lowest nanosheet channels 253 have a void length SC3 in the X-direction of from 13.4 to 18.6 nanometers (nm), and an average void length SC3 of about 15.4 nanometers (nm).

In exemplary embodiments, an average nanosheet channel void length in the AC device region 320 is greater than 14 nanometers (nm), such as greater than 14.5, or greater than 15, or greater than 15.5, or greater than 16, or greater than 16.5 nanometers (nm). In exemplary embodiments, an average nanosheet channel void length in the AC device region 320 is less than 19 nanometers (nm), such as less than 18.5, or less than 18, or less than 17.5, or less than 17 nanometers (nm). In an exemplary embodiment, the average nanosheet channel void length in the AC device region 320 is about 16.9 nanometers (nm).

In exemplary embodiments, the average nanosheet channel void length in the DC device region 310 is greater than the average nanosheet channel void length in the AC device region 320, such as at least 1.1 times greater.

It is noted that the for the lowest nanosheet channels 153 and 253, the average void length of LC3 is greater than average length of SC3. For example, the average void length of LC3 may be at least 1.1 times greater, at least 1.15 times greater, or at least 1.2 times greater than average void length of SC3.

Figure 6:
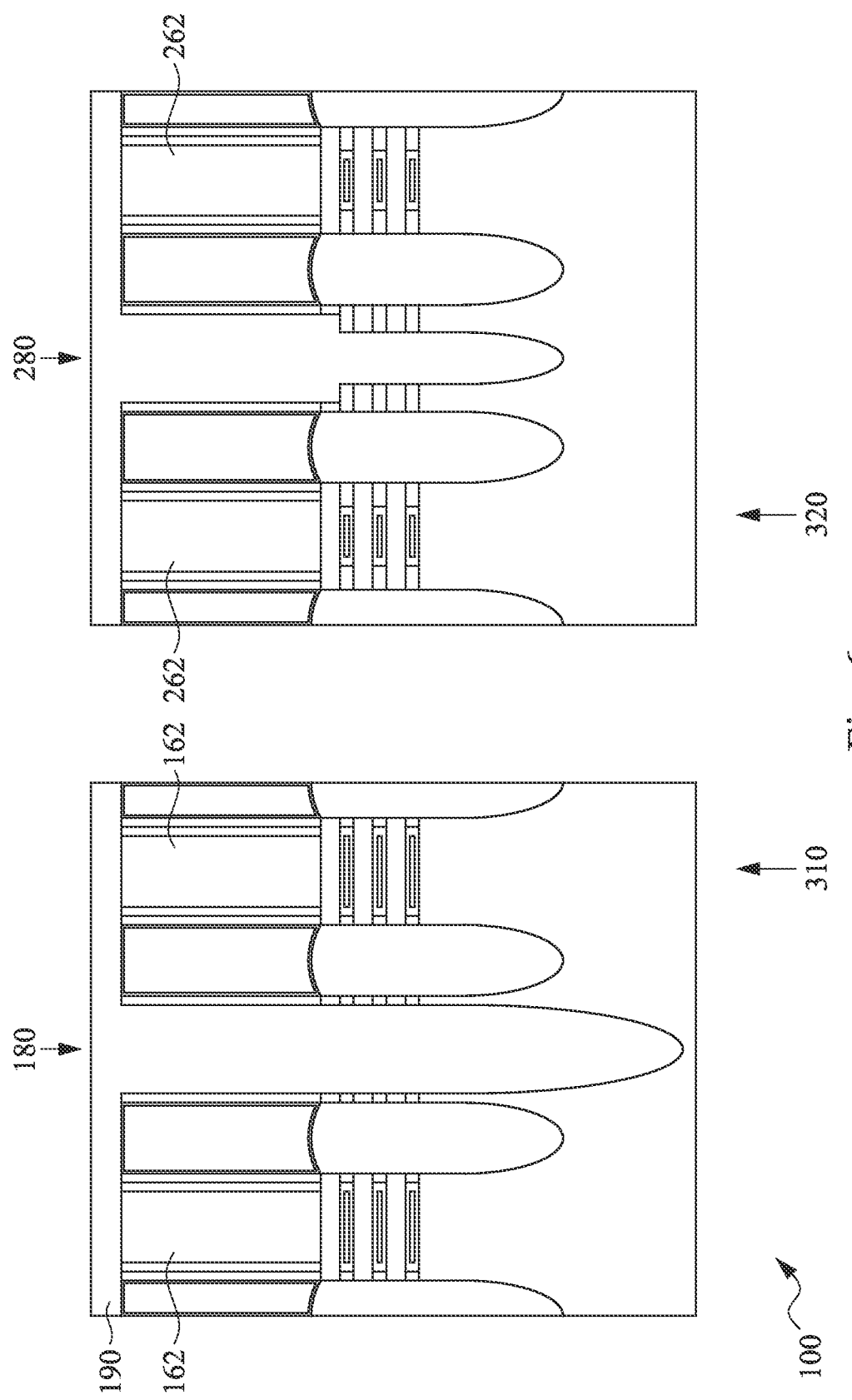

Referring back to FIG. 2, method 200 proceeds to block 208, which includes forming isolation regions in the trenches, for example a refill process is performed. With reference to FIG. 6, in an embodiment of block 208, a refill process is used to form a layer 190 over the device 100. An exemplary layer 190 is nitride. The layer 190 is also used to fill the previously formed trenches 180/280 and electrically isolate the metal layers 162/262 of adjacent structures. In some embodiments, the layer 190 includes SiN. Alternatively, in some cases, the layer 190 may include $SiO_2$, silicon oxynitride, FSG, a low-k dielectric, combinations thereof, and/or other suitable materials known in the art. In various examples, the layer 190 may be deposited by a CVD process, an SACVD process, a flowable CVD process, an ALD process, a PVD process, and/or other suitable process. In some cases, after depositing the layer 190, a chemical mechanical polishing (CMP) process may be performed to remove excess material and planarize a top surface of the device 100.

Method 200 may continue at block 210 where further processing may be performed. Generally, the further processing may form various features and regions known in the art. For example, subsequent processing may form contact openings, contact metal, as well as various contacts/vias/lines and multilayer interconnect features (e.g., metal layers and interlayer dielectrics) on the substrate 10, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after method 200, and some process steps described above may be replaced or eliminated in accordance with various embodiments of method 200.

With the structure and dimensions of the nanosheet channels 15 before and after etching explained above, the ability of the etching process to provide trenches with different desired depths may be understood. Specifically, in order to provide the metal portions 271, 272, and 273 under the nanosheet channels 251, 252, and 253 with shorter lengths, inner spacers 120 in the AC device region 320 have larger lengths, as compared to the lengths of the inner spacers 120 in the DC device regions 310.

In certain embodiments, in the AC device region, a ratio of total inner spacer length (including the lengths of two inner spacers) to gate length is greater than 1.2, such as greater than 1.5, for example greater than 1.75, such as greater than 2. On the other hand, in the DC device region, the total inner spacer length to gate length ratio is less than two, such as less than 1.5, for example less than 1, such as less than 0.75, or less than 0.5. Further, in certain embodiments the minimum length of an inner spacer in the AC device region is at least twice the maximum length of an inner spacer in the DC device region.

When each respective gate portion 171, 172, 173, 271, 272, 273, is removed, a gap is formed between respective inner spacers. Such gap is basically equal to the length of the gate portion that was removed, until the process etches the inner face of the inner spacers.

It has been found that a combination of relatively wider inner spacers and the use of selective etching chemistries that etch the inner spacers at a slower rate than they etch the other gate components effectively provides a bottleneck to the etching of the dummy structures in AC device region 320. Specifically, the increased relative length of the inner spacers 120 partially blocks etching of more material under the inner spacers 120, i.e., more material is shielded by the inner spacers. Further, the slower etching rate of the inner spacers means that a large portion of the inner spacers withstands the etching process and shields other material from etching for a longer duration.

As a result, during the etch of a structure in a DC device region, where the structure has relatively narrow inner spacers, and consequently a larger gap between the inner spacers, the etching process contacts more material lying under the gap between the inner spacers relatively more quickly, and for a relatively longer duration. As a result, deep trenches are formed in the DC device region. On the other hand, during the etch of a structure in an AC device region, where the structure has relatively wide inner spacers and a relatively narrow gap between inner spacers, the etching process contacts material lying under the gap between the inner spacers relatively more slowly, and for a relatively shorter duration. As a result, shallow trenches are formed in the DC device region.

Embodiments herein capitalize on the different etching profiles to form deeper isolation regions between DC devices having long channels and shallower isolation regions between AC devices having short channels. This is beneficial as parasitic capacitance is proportional to the depth of the isolation.

High parasitic capacitance provides for better DC performance, as all channels are turned on. On the other hand, small parasitic capacitance provide for worse DC performance as channel are only partially turned on. Conversely, low parasitic capacitance provides for worse DC performance but better AC performance.

Embodiments herein provide DC devices with long channels and deep trenches for large parasitic capacitance and improved performance. At the same time, embodiments herein provide AC devices with short channels and shallow trenches for small parasitic capacitance and improved performance.

Embodiments herein utilize a shared etching process over both DC and AC regions to form trenches of the desired depth for improved performance of each type of device.

By employing the disclosed process, a process window may be enlarged and device performance and reliability of transistors formed in the adjacent active regions will be enhanced. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure describes a method including forming gate structures over a semiconductor material, wherein the gate structures include a long channel (LC) gate structure and a short channel (SC) gate structure; forming a patterned mask over the semiconductor material, wherein the LC gate structure and the SC gate structure are not covered by the patterned mask; and performing an etch process on the LC gate structure and on the SC gate structure through the patterned mask to remove the LC gate structure and the SC gate structure, wherein removal of the LC gate structure forms a deep trench in the semiconductor substrate having a first depth, and wherein removal of the SC gate structure forms a shallow trench in the semiconductor substrate having a second depth less than the first depth.

In certain embodiments, the method further includes forming isolation structures in the deep trench and in the shallow trench.

In certain embodiments, performing the etch process includes performing a $HBr/O_2$ plasma etch; performing a $HBr/CO_2$ etch; and performing a HBr/Ar etch.

In certain embodiments, the first depth is greater than 1.5 times the second depth.

In certain embodiments, the deep trench has an aspect ratio of at least 6, and wherein the shallow trench has an aspect ratio of no more than 5.

In certain embodiments, the deep trench has a first aspect ratio, the shallow trench has a second aspect ratio, and the first aspect ratio is at least 1.2 times the second aspect ratio.

In certain embodiments, forming gate structures over the semiconductor material includes: forming each gate structure with parallel spaced-apart nanosheets defining channel regions; forming high-k material vertically between adjacent nanosheets and laterally between inner spacers, wherein the inner spacers have a total inner spacer length; and forming a conductive gate between adjacent nanosheets, wherein the high-k material and the conductive gate material under an uppermost nanosheet define a gate length; wherein, in the LC gate structure, a total inner spacer length to gate length ratio is less than two; and wherein, in the SC gate structure, a total inner spacer length to gate length ratio is greater than two.

In certain embodiments, before performing the etch process: the LC gate structure includes an uppermost LC nanosheet forming an uppermost LC channel region; an underlying portion of a LC gate material contacts an underside of the uppermost LC nanosheet; the underlying portion of LC gate material has a first length; the SC gate structure includes an uppermost SC nanosheet forming an uppermost SC channel region; an underlying portion of a SC gate material contacts an underside of the uppermost SC nanosheet; the underlying portion of SC gate material has a second length; and the first length greater than 1.8 times the second length.

In certain embodiments, before performing the etch process: the LC gate structure defines at least one LC channel region; an LC source/drain region is located at each end of the at least one LC channel region; an LC inner spacer is located between each respective LC source/drain region and the at least one LC channel region; each LC inner spacer has a LC maximum length; the SC gate structure defines at least one SC channel region; an SC source/drain region is located at each end of the at least one SC channel region; an SC inner spacer is located between each respective SC source/drain region and the at least one SC channel region; each SC inner spacer has a SC minimum length; and the SC minimum length is at least twice the LC maximum length.

In another embodiment, a method is provided and includes providing a semiconductor substrate with a direct current (DC) device region and an alternating current (AC) device region; forming three DC gates in the DC device region and three AC gates in the AC device region; wherein the three DC gates include a first DC gate, a second DC gate, and a middle DC gate between the first DC gate and the second DC gate; and wherein the three AC gates include a first AC gate, a second AC gate, and a middle AC gate between the first AC gate and the second AC gate; performing an etch process on the semiconductor substrate to simultaneously remove the middle DC gate and the middle AC gate, wherein the etch process forms a deep trench in the DC device region having a first depth, and wherein the etch process forms a shallow trench in the AC region having a second depth less than the first depth; and forming an isolation material in the deep trench and in the shallow trench to isolate the first DC gate from the second DC gate and to isolate the first AC gate from the second AC gate.

In certain embodiments, performing the etch process includes: performing a $HBr/O_2$ plasma etch; performing a $HBr/CO_2$ etch; and performing a HBr/Ar etch.

In certain embodiments, forming each gate comprises forming each gate in a dielectric material overlying the semiconductor substrate and in between source/drain regions overlying the semiconductor substrate, wherein each gate includes gate material located over and between spaced apart nanosheets extending between opposite source/drain regions; and wherein inner spacers are located between the gate material and the opposite source/drain regions.

In certain embodiments, the gate material includes a high-k material and a conductive fill material.

In certain embodiments, the first DC gate and the second DC gate include gate portions underlying a nanosheet channel and having an average gate length of greater than 13 nanometers (nm); and the first AC gate and the second AC gate include gate portions underlying a nanosheet channel and having an average gate length of less than 11 nanometers (nm).

In certain embodiments, the first DC gate and the second DC gate include gate portions underlying a first nanosheet channel and having an average DC gate length; the first AC gate and the second AC gate include gate portions underlying a second nanosheet channel and having an average AC gate length; and the average DC gate length is greater than 1.5 times the average AC gate length.

In other embodiments, a multi-gate device is provided and includes a semiconductor substrate with a direct current (DC) device region and an alternating current (AC) device region; a first DC gate and a second DC gate in the DC device region; a DC region isolation material in a deep trench located between the first and second DC gates, wherein the deep trench has a first depth; a first AC gate and a second AC gate in the AC device region; and an AC region isolation material in a shallow trench located between the first and second AC gates, wherein the shallow trench has a second depth less than the first depth.

In certain embodiments, the first depth is at least 1.5 times the second depth.

In certain embodiments, the first and second DC gates include gate portions underlying a nanosheet channel and having an average gate length of greater than 13 nanometers (nm); and the first and second AC gates include gate portions underlying a nanosheet channel and having an average gate length of less than 11 nanometers (nm).

In certain embodiments, the first and second DC gates include gate portions underlying a nanosheet channel and having an average DC gate length; the first and second AC gates include gate portions underlying a nanosheet channel and having an average AC gate length; and the average DC gate length is greater than 1.5 times the average AC gate length.

In certain embodiments, the first and second DC gates include nanosheet channels separated by an average DC channel void length; the first and second AC gates include nanosheet channels separated by an average AC channel void length; and the average DC channel void length is at least 1.1 times greater than the average AC channel void length.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method comprising:
   forming gate structures over a semiconductor material, wherein the gate structures include a long channel (LC) gate structure and a short channel (SC) gate structure;
   forming a patterned mask over the semiconductor material, wherein the LC gate structure and the SC gate structure are not covered by the patterned mask; and
   performing an etch process on the LC gate structure and on the SC gate structure through the patterned mask to remove the LC gate structure and the SC gate structure, wherein removal of the LC gate structure forms a deep trench in the semiconductor material having a first depth, and wherein removal of the SC gate structure forms a shallow trench in the semiconductor material having a second depth less than the first depth.

2. The method of claim 1, further comprising forming isolation structures in the deep trench and in the shallow trench.

3. The method of claim 1, wherein performing the etch process comprises:
   performing a HBr/O$_2$ plasma etch;
   performing a HBr/CO$_2$ etch; and
   performing a HBr/Ar etch.

4. The method of claim 1, wherein the first depth is greater than 1.5 times the second depth.

5. The method of claim 1, wherein the deep trench has an aspect ratio of at least 6, and wherein the shallow trench has an aspect ratio of no more than 5.

6. The method of claim 1, wherein the deep trench has a first aspect ratio, wherein the shallow trench has a second aspect ratio, and wherein the first aspect ratio is at least 1.2 times the second aspect ratio.

7. The method of claim 1, wherein forming gate structures over the semiconductor material comprises:
   forming each gate structure with parallel spaced-apart nanosheets defining channel regions;
   forming a high-k material vertically between adjacent nanosheets and laterally between inner spacers, wherein the inner spacers have a total inner spacer length; and
   forming a conductive gate material between adjacent nanosheets, wherein the high-k material and the conductive gate material under an uppermost nanosheet define a gate length;
   wherein, in the LC gate structure, a total inner spacer length to gate length ratio is less than two; and
   wherein, in the SC gate structure, a total inner spacer length to gate length ratio is greater than two.

8. The method of claim 1, wherein, before performing the etch process:
   the LC gate structure includes an uppermost LC nanosheet forming an uppermost LC channel region;
   an underlying portion of a LC gate material contacts an underside of the uppermost LC nanosheet;
   the underlying portion of LC gate material has a first length;
   the SC gate structure includes an uppermost SC nanosheet forming an uppermost SC channel region;
   an underlying portion of a SC gate material contacts an underside of the uppermost SC nanosheet;
   the underlying portion of SC gate material has a second length; and
   the first length greater than 1.8 times the second length.

9. The method of claim 1, wherein, before performing the etch process:
   the LC gate structure defines at least one LC channel region;
   an LC source/drain region is located at each end of the at least one LC channel region;
   an LC inner spacer is located between each respective LC source/drain region and the at least one LC channel region;
   each LC inner spacer has a LC maximum length;
   the SC gate structure defines at least one SC channel region;
   an SC source/drain region is located at each end of the at least one SC channel region;
   an SC inner spacer is located between each respective SC source/drain region and the at least one SC channel region;
   each SC inner spacer has a SC minimum length; and
   the SC minimum length is at least twice the LC maximum length.

10. A method comprising:
    providing a semiconductor substrate with a direct current (DC) device region and an alternating current (AC) device region;
    forming three DC gates in the DC device region and three AC gates in the AC device region; wherein the three DC gates include a first DC gate, a second DC gate, and a middle DC gate between the first DC gate and the second DC gate; and wherein the three AC gates include a first AC gate, a second AC gate, and a middle AC gate between the first AC gate and the second AC gate;
    performing an etch process on the semiconductor substrate to simultaneously remove the middle DC gate and the middle AC gate, wherein the etch process forms a deep trench in the DC device region having a first depth, and wherein the etch process forms a shallow trench in the AC device region having a second depth less than the first depth; and forming an isolation material in the deep trench and in the shallow trench to isolate the first DC gate from the second DC gate and to isolate the first AC gate from the second AC gate.

11. The method of claim 10, wherein performing the etch process comprises:
performing a HBr/$O_2$ plasma etch;
performing a HBr/$CO_2$ etch; and
performing a HBr/Ar etch.

12. The method of claim 10, wherein forming each gate comprises forming each gate in a dielectric material overlying the semiconductor substrate and in between source/drain regions overlying the semiconductor substrate, wherein each gate comprises gate material located over and between spaced apart nanosheets extending between opposite source/drain regions; and wherein inner spacers are located between the gate material and the opposite source/drain regions.

13. The method of claim 12, wherein the gate material includes a high-k material and a conductive fill material.

14. The method of claim 10, wherein:
the first DC gate and the second DC gate include gate portions underlying a nanosheet channel and having an average gate length of greater than 13 nanometers (nm); and
the first AC gate and the second AC gate include gate portions underlying a nanosheet channel and having an average gate length of less than 11 nanometers (nm).

15. The method of claim 10, wherein:
the first DC gate and the second DC gate include gate portions underlying a first nanosheet channel and having an average DC gate length;
the first AC gate and the second AC gate include gate portions underlying a second nanosheet channel and having an average AC gate length; and
the average DC gate length is greater than 1.5 times the average AC gate length.

16. A multi-gate device comprising:
a semiconductor substrate with a direct current (DC) device region and an alternating current (AC) device region;
a first DC gate and a second DC gate in the DC device region;
a DC region isolation material in a deep trench located between the first and second DC gates, wherein the deep trench has a first depth;
a first AC gate and a second AC gate in the AC device region; and
an AC region isolation material in a shallow trench located between the first and second AC gates, wherein the shallow trench has a second depth less than the first depth.

17. The multi-gate device of claim 16, wherein the first depth is at least 1.5 times the second depth.

18. The multi-gate device of claim 16, wherein:
the first and second DC gates include gate portions underlying a nanosheet channel and having an average gate length of greater than 13 nanometers (nm); and
the first and second AC gates include gate portions underlying a nanosheet channel and having an average gate length of less than 11 nanometers (nm).

19. The multi-gate device of claim 16, wherein:
the first and second DC gates include gate portions underlying a nanosheet channel and having an average DC gate length;
the first and second AC gates include gate portions underlying a nanosheet channel and having an average AC gate length; and
the average DC gate length is greater than 1.5 times the average AC gate length.

20. The multi-gate device of claim 16, wherein:
the first and second DC gates include nanosheet channels separated by an average DC channel void length;
the first and second AC gates include nanosheet channels separated by an average AC channel void length; and
the average DC channel void length is at least 1.1 times greater than the average AC channel void length.

* * * * *